(12) United States Patent
Robinson et al.

(10) Patent No.: US 11,162,661 B2
(45) Date of Patent: Nov. 2, 2021

(54) ILLUMINATION APPARATUS COMPRISING PASSIVE OPTICAL NANOSTRUCTURES

(71) Applicant: RealD Spark, LLC, Beverly Hils, CA (US)

(72) Inventors: Michael G. Robinson, Boulder, CO (US); Graham J. Woodgate, Henley-on-Thames (GB); Jonathan Harrold, Leamington Spa (GB)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 17/060,476

(22) Filed: Oct. 1, 2020

(65) Prior Publication Data

US 2021/0102686 A1    Apr. 8, 2021

Related U.S. Application Data

(60) Provisional application No. 62/910,204, filed on Oct. 3, 2019, provisional application No. 62/979,029, filed
(Continued)

(51) Int. Cl.
*H01L 25/075* (2006.01)
*F21V 7/00* (2006.01)
(Continued)

(52) U.S. Cl.
CPC ............. *F21V 7/0091* (2013.01); *F21V 3/00* (2013.01); *F21V 9/30* (2018.02); *H01L 25/0753* (2013.01); *F21Y 2115/10* (2016.08)

(58) Field of Classification Search
CPC ..................................................... H01L 33/26
See application file for complete search history.

(56) References Cited

U.S. PATENT DOCUMENTS 5,184,114 A    2/1993    Brown
5,812,105 A    9/1998    Ven
(Continued)

FOREIGN PATENT DOCUMENTS

CN    102859268 A    1/2013
CN    103117348 A    5/2013
(Continued)

OTHER PUBLICATIONS

International search report and written opinion of international searching authority for PCT application PCT/US2020/050527 dated Feb. 3, 2021.
(Continued)

*Primary Examiner* — Keith G. Delahoussaye
(74) *Attorney, Agent, or Firm* — Penny L. Lowry

(57) ABSTRACT

An illumination apparatus comprises a first substrate; an optical structure; an array of light emitting elements disposed between the first substrate and the optical structure and an array of passive optical nanostructures disposed between the first substrate and the optical structure. Each of the passive optical nanostructures are disposed on a respective one of the light emitting elements and each passive optical nanostructure comprises an air gap. Each passive optical nanostructure is disposed between its respective light emitting element and the optical structure, wherein each passive optical nanostructure is configured to receive light emitted by its respective light emitting element, pass the received light, and output the pass light towards the optical structure.

23 Claims, 11 Drawing Sheets

Related U.S. Application Data on Feb. 20, 2020, provisional application No. 62/979,039, filed on Feb. 20, 2020.

(51) Int. Cl.
- *F21V 3/00* (2015.01)
- *F21V 9/30* (2018.01)
- *F21Y 115/10* (2016.01)

(56) References Cited

U.S. PATENT DOCUMENTS

| | | | |
|---|---|---|---|
| 6,547,423 B2 | 4/2003 | Marshall et al. |
| 6,570,324 B1 | 5/2003 | Tutt et al. |
| 7,014,964 B1 | 3/2006 | Hsu et al. |
| 7,171,874 B1 | 2/2007 | Huang |
| 7,863,614 B2 | 1/2011 | Toyama et al. |
| 7,994,531 B2 | 8/2011 | Lin et al. |
| 9,519,153 B2 | 12/2016 | Robinson et al. |
| 10,121,772 B1 | 11/2018 | Wu et al. |
| 10,126,575 B1 | 11/2018 | Robinson et al. |
| 10,303,030 B2 | 5/2019 | Robinson et al. |
| 10,533,730 B2 | 1/2020 | Harrold et al. |
| 2004/0080938 A1 | 4/2004 | Holman et al. |
| 2004/0089935 A1 | 5/2004 | Lehner |
| 2004/0126911 A1 | 7/2004 | Kimura |
| 2004/0161871 A1 | 8/2004 | Omori |
| 2004/0218390 A1 | 11/2004 | Holman et al. |
| 2004/0239243 A1 | 12/2004 | Roberts et al. |
| 2004/0263061 A1 | 12/2004 | Ishikawa et al. |
| 2005/0111100 A1 | 5/2005 | Mather et al. |
| 2005/0219693 A1 | 10/2005 | Hartkop et al. |
| 2006/0152931 A1 | 7/2006 | Holman |
| 2006/0256255 A1 | 11/2006 | Minami |
| 2006/0002902 A1 | 12/2006 | Cok et al. |
| 2007/0007237 A1 | 1/2007 | Wu et al. |
| 2007/0019131 A1 | 1/2007 | Choi et al. |
| 2007/0047254 A1 | 3/2007 | Schardt et al. |
| 2007/0116424 A1 | 5/2007 | Ting et al. |
| 2007/0165394 A1 | 7/2007 | Chang |
| 2007/0176195 A1 | 8/2007 | Kuiseko et al. |
| 2007/0242477 A1 | 10/2007 | Yoo et al. |
| 2007/0256453 A1 | 11/2007 | Barnes et al. |
| 2008/0043466 A1 | 2/2008 | Chakmakjian et al. |
| 2008/0089093 A1 | 4/2008 | Miller et al. |
| 2008/0123350 A1 | 5/2008 | Choe et al. |
| 2008/0225523 A1 | 9/2008 | Samber et al. |
| 2008/0237612 A1 | 10/2008 | Cok |
| 2008/0258162 A1 | 10/2008 | Koung et al. |
| 2008/0315755 A1 | 12/2008 | Han |
| 2009/0001869 A1 | 1/2009 | Tanimoto et al. |
| 2009/0086508 A1 | 4/2009 | Bierhuizen |
| 2009/0109656 A1 | 4/2009 | Chang |
| 2009/0128735 A1 | 5/2009 | Larson et al. |
| 2009/0242929 A1 | 10/2009 | Lin |
| 2009/0268428 A1 | 10/2009 | Tsukada |
| 2009/0296389 A1 | 12/2009 | Hsu |
| 2010/0061096 A1 | 3/2010 | Sato |
| 2010/0097809 A1 | 4/2010 | Munro et al. |
| 2010/0165635 A1 | 7/2010 | Chen et al. |
| 2010/0171215 A1 | 7/2010 | Fischer et al. |
| 2010/0195330 A1 | 8/2010 | Schaefer et al. |
| 2010/0258543 A1 | 10/2010 | Mizuno et al. |
| 2010/0295762 A1 | 11/2010 | Yeom et al. |
| 2010/0317132 A1 | 12/2010 | Rogers et al. |
| 2011/0003410 A1 | 1/2011 | Tsay et al. |
| 2011/0018860 A1 | 1/2011 | Parry-Jones et al. |
| 2011/0038150 A1 | 2/2011 | Woodgate et al. |
| 2011/0090672 A1 | 4/2011 | Zhu et al. |
| 2011/0151602 A1 | 6/2011 | Speier |
| 2011/0194034 A1 | 8/2011 | Shimizu |
| 2011/0255303 A1 | 10/2011 | Nichol et al. |
| 2012/0086875 A1 | 4/2012 | Yokota |
| 2012/0119237 A1 | 5/2012 | Leatherdale et al. |
| 2012/0140462 A1 | 6/2012 | Pickard |
| 2012/0258963 A1 | 10/2012 | Berger et al. |
| 2012/0320627 A1 | 12/2012 | Araki et al. |
| 2013/0039062 A1 | 2/2013 | Vinther et al. |
| 2013/0107525 A1 | 5/2013 | Woodgate et al. |
| 2013/0121000 A1 | 5/2013 | Lee et al. |
| 2013/0258663 A1 | 10/2013 | Woodgate et al. |
| 2013/0293793 A1 | 11/2013 | Lu |
| 2014/0022619 A1 | 1/2014 | Woodgate et al. |
| 2014/0098418 A1 | 4/2014 | Lin |
| 2014/0140654 A1 | 5/2014 | Brown et al. |
| 2014/0186979 A1 | 7/2014 | Tu et al. |
| 2014/0211462 A1 | 7/2014 | Keller et al. |
| 2014/0211503 A1 | 7/2014 | Tarsa |
| 2014/0240828 A1 | 8/2014 | Robinson et al. |
| 2014/0240839 A1 | 8/2014 | Yang et al. |
| 2014/0316742 A1 | 10/2014 | Sun et al. |
| 2015/0054011 A1 | 2/2015 | Koizumi et al. |
| 2015/0062490 A1 | 3/2015 | Kwon |
| 2015/0160396 A1 | 6/2015 | Wilcox et al. |
| 2015/0268479 A1 | 9/2015 | Woodgate et al. |
| 2015/0268513 A1 | 9/2015 | Chang et al. |
| 2015/0295154 A1 | 10/2015 | Tu et al. |
| 2015/0308635 A1 | 10/2015 | Li et al. |
| 2016/0018077 A1 | 1/2016 | Mallory et al. |
| 2016/0211413 A1 | 7/2016 | Park et al. |
| 2016/0299281 A1 | 10/2016 | Robinson et al. |
| 2017/0031085 A1 | 2/2017 | Limetai. |
| 2017/0045666 A1 | 2/2017 | Vasylyev |
| 2017/0059127 A1 | 3/2017 | Jansma et al. |
| 2017/0102127 A1 | 4/2017 | Woodgate et al. |
| 2017/0139114 A1 | 5/2017 | Woodgate et al. |
| 2017/0154919 A1 | 6/2017 | Chen et al. |
| 2017/0161179 A1 | 6/2017 | Maple et al. |
| 2017/0205959 A1 | 7/2017 | Seong |
| 2017/0248289 A1 | 8/2017 | Vasylyev |
| 2017/0261179 A1 | 9/2017 | Wu et al. |
| 2018/0014007 A1 | 1/2018 | Brown |
| 2018/0226384 A1 | 8/2018 | Park et al. |
| 2018/0321553 A1 | 11/2018 | Robinson et al. |
| 2019/0086706 A1 | 3/2019 | Robinson et al. |
| 2019/0139243 A1* | 5/2019 | You ............... H04N 13/254 |
| 2019/0220121 A1 | 7/2019 | Kim et al. |
| 2019/0250458 A1 | 8/2019 | Robinson et al. |
| 2019/0265478 A1 | 8/2019 | Cok et al. |
| 2019/0278135 A1 | 9/2019 | Woodgate et al. |
| 2019/0294004 A1 | 9/2019 | Hashimoto |
| 2019/0377067 A1* | 12/2019 | Han ............... G01S 17/04 |
| 2020/0049876 A1 | 2/2020 | Watanabe et al. |
| 2020/0159055 A1 | 5/2020 | Robinson et al. |
| 2020/0166783 A1* | 5/2020 | Roy ............... B82Y 20/00 |
| 2020/0259307 A1* | 8/2020 | Sharma ........... G02B 5/045 |
| 2020/0321553 A1 | 10/2020 | Kwon et al. |
| 2020/0355896 A1 | 11/2020 | Woodgate et al. |

FOREIGN PATENT DOCUMENTS

| | | | |
|---|---|---|---|
| DE | 102010031945 A1 | 1/2012 | |
| EP | 1387412 A1 | 2/2004 | |
| EP | 1835550 A2 | 9/2007 | |
| EP | 1890343 A1 | 2/2008 | |
| EP | 1986023 A1 | 10/2008 | |
| EP | 2182783 A2 | 5/2010 | |
| EP | 2595295 A1 | 5/2013 | |
| GB | 2464102 A | 4/2010 | |
| GB | 2484711 A | 4/2012 | |
| JP | 2000323755 A | 11/2000 | |
| JP | 2009295309 A | 12/2009 | |
| JP | 2010238846 A | 10/2010 | |
| JP | 2013219397 A | 10/2013 | |
| WO | WO-2006115313 A1 * | 11/2006 | ............ H01J 63/06 |
| WO | 2007074932 A1 | 7/2007 | |
| WO | 2010038025 A2 | 4/2010 | |
| WO | 2010038025 A3 | 6/2010 | |
| WO | 2011131200 A1 | 10/2011 | |
| WO | 2012052722 A2 | 4/2012 | |
| WO | 2012052723 A1 | 4/2012 | |
| WO | 2013064801 A1 | 5/2013 | |
| WO | 2013112435 A1 | 8/2013 | |
| WO | 2014043384 A1 | 3/2014 | |
| WO | 2015089517 A1 | 6/2015 | |

(56) References Cited

FOREIGN PATENT DOCUMENTS

| WO | 2017007770 A2 | 1/2017 |
| WO | 2018185475 A1 | 10/2018 |
| WO | 2018185476 A1 | 10/2018 |
| WO | 2018208618 A1 | 11/2018 |
| WO | 2019067846 A1 | 4/2019 |
| WO | 2019107826 A1 | 6/2019 |

OTHER PUBLICATIONS

International search report and written opinion of international searching authority for PCT application PCT/US2020/053825 dated Dec. 30, 2020.
EP18200530.6—European Search Report of the European Patent Office dated May 23, 2019.
International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/021570 dated May 24, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2021/018544 dated Apr. 29, 2021.
CN201880036805.8 Notification of the First Office Action dated Jul. 23, 2021.
CN201880036842.9 Notification of the First Office Action dated Jul. 23, 2021.

* cited by examiner

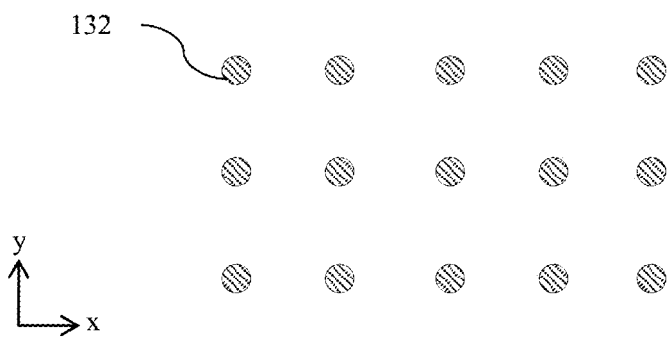
FIG. 6A
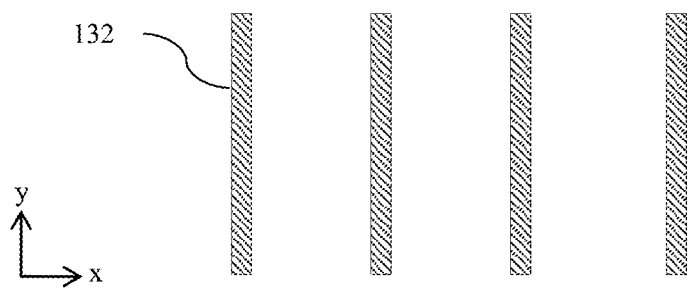
FIG. 6B
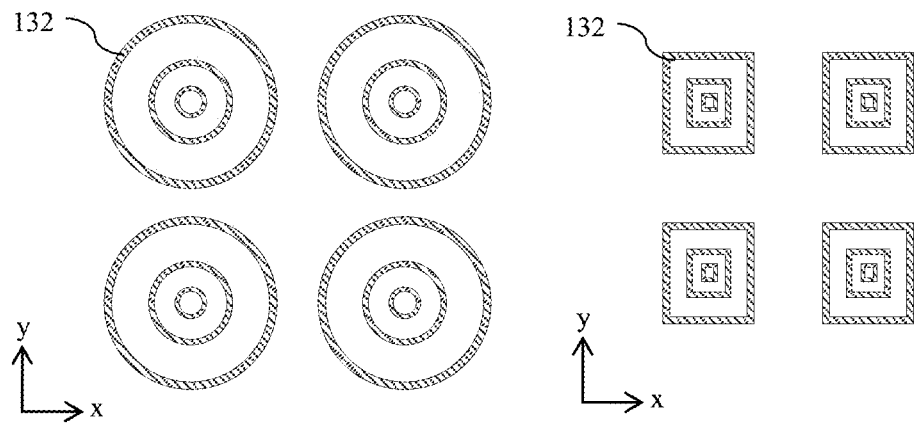
FIG. 6C
FIG. 6D

ILLUMINATION APPARATUS COMPRISING PASSIVE OPTICAL NANOSTRUCTURES

TECHNICAL FIELD

The present disclosure relates to illumination apparatuses including display apparatuses.

BACKGROUND

Illumination apparatuses in which micro-LEDs are used, e.g. for displays such as laptop or TV displays, are becoming increasingly commercially relevant. In these types of displays, it is typically desirable to prevent optical cross-talk. It is also typically desirable to provide a physically robust structure for the display.

BRIEF SUMMARY

According to a first aspect of the present disclosure, there is provided an illumination apparatus, comprising a first substrate, an optical structure, an array of light emitting elements disposed between the first substrate and the optical structure, an array of passive optical nanostructures disposed between the first substrate and the optical structure, each passive optical nanostructure being disposed on a respective one of the light emitting elements, each passive optical nanostructure comprising an air gap, and each passive optical nanostructure being disposed between its respective light emitting element and the optical structure, wherein each passive optical nanostructure is configured to receive light emitted by its respective light emitting element, pass the received light therethrough, and output the pass light towards the optical structure.

The optical structure may be arranged to direct light from a light emitting element and direct to a desirable location or angular range. Cross talk between adjacent optical elements of the optical structure is reduced and directionality of optical output from the illumination apparatus maintained. The passive optical nanostructures may be fabricated from monolithic wafers with high resolution optical features. The passive optical nanostructures may be provided with low area, reducing cost and increasing performance. High uniformity of passive optical nanostructures may be achieved.

Each passive optical nanostructure may comprise a plurality of spacers configured to separate its respective light emitting element from the optical structure. The air gap may comprise air which fills the space in between the plurality of spacers. Light from the light emitting element is passed by the passive optical nanostructure such that the light cone within the optical structure is within the critical angle of the light in the medium. Advantageously cross talk between adjacent optical elements of the optical structure is reduced.

A height of each of the plurality of spacers of each passive optical nanostructure may be greater than a wavelength of the light emitted by the respective light emitting element. Light from the light emitting element is passed by the passive optical nanostructure such that the light cone within the optical structure may be substantially the same as the critical angle of the light in the medium of the optical structure. Advantageously cross talk between adjacent optical elements of the optical structure is reduced. Light rays may be arranged to guide within the optical structure. Advantageously high output uniformity may be achieved over a wide area.

The illumination apparatus may further comprise a cup surrounding each of the plurality of passive optical nanostructures and its respective light emitting element. Advantageously cross talk may be further reduced.

At least some of the light emitted by each light emitting element may undergo total internal reflection at an interface with the air gap. Advantageously light rays may recirculate within the light emitting element to increase device efficiency.

The passive optical nanostructures may be hydrophobic. Advantageously, adhesive materials may not fill the gaps between the spacers of the passive optical nanostructures and optical output may be maintained within the critical angle within the optical structure.

The optical structure may be a catadioptric optical structure. Advantageously narrow output cone angles may be provided for output from the illumination apparatus with low thickness.

The illumination apparatus may further comprise an adhesive layer arranged to adhere the optical structure to the passive optical nanostructures. The first substrate and optical structure may be optically bonded to advantageously achieve increased resilience to variations in environmental conditions. Some light rays passing from the optical structure to the optical structure may be transmitted with low loss, increasing output efficiency.

The illumination apparatus may further comprise a colour conversion layer disposed between each light emitting element and its respective passive optical nanostructure. Advantageously output colour may be determined.

The light emitting elements may be micro-LEDs with a maximum dimension which is less than 300 μm. The light emitting elements may be micro-LEDs with a maximum dimension which is preferably less than 200 μm and most preferably less than 100 μm. Advantageously low thickness optical elements may be provided.

The illumination apparatus may further comprise a mask comprising a plurality of apertures therein, the mask being disposed on an opposite side of the first substrate to the array of light emitting elements. The optical structure may be configured to direct at least some of the light received from the array of light emitting elements through the apertures in the mask. Advantageously the illumination apparatus may be provided with high output efficiency. Low reflectivity of the illumination apparatus may be achieved. In a display apparatus high image contrast may be achieved.

According to a second aspect of the present disclosure there is provided a backlight apparatus comprising the illumination apparatus of the first aspect. Advantageously a low thickness high efficiency backlight may be provided with high resilience to environmental changes. The backlight may be flexible and have widely separated micro-LEDs, reducing micro-LED cost. High levels of collimation may be achieved.

According to a third aspect of the present disclosure, there is provided a display apparatus comprising the illumination apparatus of the first aspect or the backlight apparatus of the second aspect. A display apparatus with high image contrast in brightly lit ambient environments and with high efficiency with a low thickness may advantageously be achieved. A low stray light display such as a privacy display or a display for night-time operation may be provided.

According to a fourth aspect of the present disclosure, there is provided a method of manufacturing an illumination apparatus, comprising mounting an array of light emitting elements on a substrate, mounting a passive optical nanostructure on each of the light emitting elements, each passive optical nanostructure comprising an air gap, bonding an optical structure to the substrate such that each passive optical nanostructure is disposed between its respective light emitting element and the optical structure. Advantageously the illumination apparatus may be provided. High precision nanostructures may be provided on a monolithic wafer substrate and only those passive optical nanostructures that meet desirable performance levels may be transferred. High uniformity and low cost may be achieved.

The array of light emitting elements may be a non-monolithic array of light emitting elements. The method may further comprise extracting the non-monolithic array of light emitting elements from a monolithic wafer. Advantageously the light-emitting elements may be provided on a monolithic wafer substrate and only those light emitting elements that meet desirable performance levels may be transferred. High uniformity and low cost may be achieved.

BRIEF DESCRIPTION OF THE DRAWINGS

Embodiments are illustrated by way of example in the accompanying FIGURES, in which like reference numbers indicate similar parts, and in which:

FIG. 3 illustrates a perspective view of a monolithic wafer that the passive optical nanostructure is formed as part of;

FIGS. 6A, 6B, 6C, and 6D respectively illustrate top views of embodiments of pluralities of spacers;

DETAILED DESCRIPTION

Figure 1A:
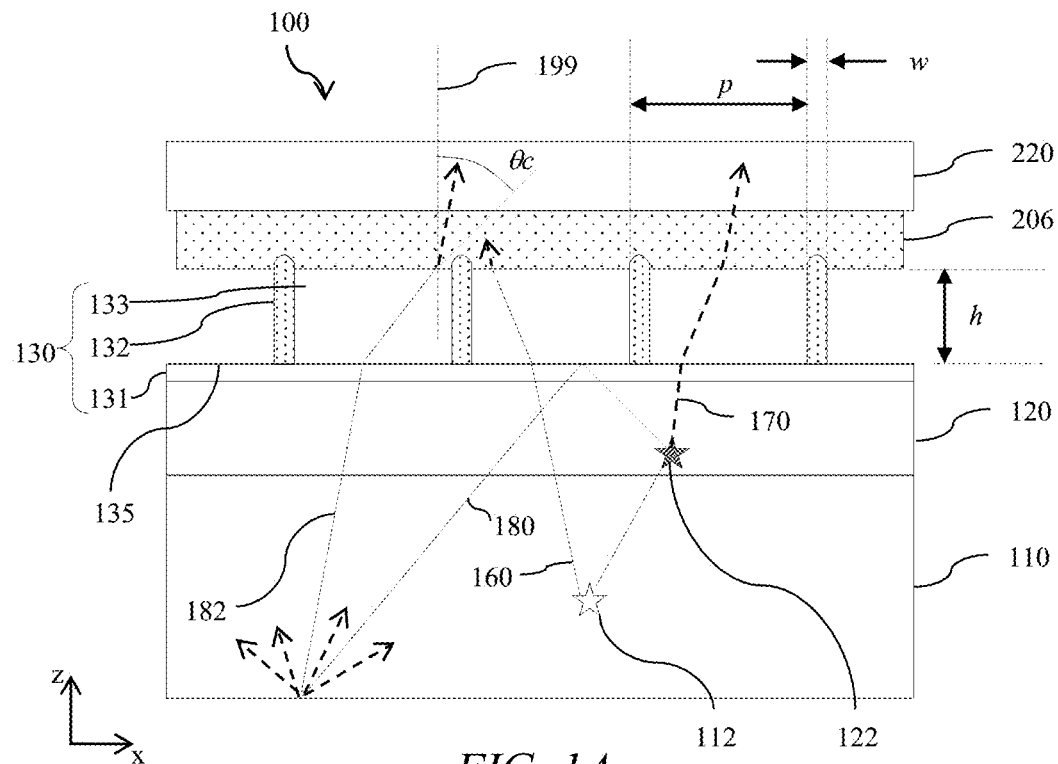
FIG. 1A illustrates a cross-sectional view of a section of an illumination apparatus according to an embodiment.

In this specification, (except when qualified by the term "packaged"), "LED" or "micro-LED" refers to an unpackaged LED die chip extracted directly from a monolithic wafer, i.e. a semiconductor element. Micro-LEDs may be formed by array extraction methods in which multiple LEDs are removed from a monolithic epitaxial wafer in parallel and may be arranged with positional tolerances that are less than 5 micrometres. This is different from packaged LEDs. Packaged LEDs typically have a lead-frame and plastic or ceramic package with solder terminals suitable for standard surface-mount PCB (printed circuit board) assembly. The size of the packaged LEDs and limits of PCB assembly techniques means that displays formed from packaged LEDs are difficult to assemble with pixel pitches below about 1 mm. The accuracy of components placed by such assembly machines is typically about plus or minus 30 micrometres. Such sizes and tolerances prevent application to very high-resolution displays.

The structure and operation of various directional display devices will now be described. In this description, common elements have common reference numerals. It is noted that the disclosure relating to any element applies to each device in which the same or corresponding element is provided. Accordingly, for brevity such disclosure is not repeated.

FIG. 1A illustrates a cross-sectional view of a section of an illumination apparatus 100 according to an embodiment. The illumination apparatus 100 comprises a light emitting element 110, a colour conversion layer 120, a passive optical nanostructure 130, an adhesive layer 206, and an optical structure 220, stacked in that order.

The illumination apparatus 100 further comprises a first substrate 200. An array of light emitting elements 110 is disposed between the first substrate 200 and the optical structure 220. An array of passive optical nanostructures 130 is disposed between the first substrate 200 and the optical structure 220, each passive optical nanostructure 130 being disposed on a respective one of the light emitting elements 110, each passive optical nanostructure comprising an air gap 133, and each passive optical nanostructure 130 being disposed between its respective light emitting element 110 and the optical structure 220, wherein each passive optical nanostructure 130 is configured to receive light emitted by its respective light emitting element 110, pass the received light 170, 180 therethrough, and output the pass light towards the optical structure 220. Each passive optical nanostructure 130 comprises a plurality of spacers 132 configured to separate its respective light emitting element 110 from the optical structure 220. The air gap 133 comprises air which fills the space in between the plurality of spacers 132. The light emitting element 110 is configured to emit light in a particular wavelength band (e.g. red, blue or green). In this embodiment, the light emitting element is a light emitting diode (LED). More specifically, in this embodiment, the light emitting diode is a micro-LED, i.e. an LED which has a maximum size or dimension of less than 300 μm, preferably less than 200 μm and most preferably less than 100 μm. Light rays 160 are emitted by excitations 112 within the emission layer of the micro-LED. The colour conversion layer 120 is disposed between each light emitting element 110 and its respective passive optical nanostructure 130. The colour conversion layer 120 is configured to receive the light rays 160 emitted by the light emitting element 110, absorb at least some of the light at absorption region 122, and emit light rays 170 in a different wavelength band to the wavelength band of the light emitted by the light emitting element 110. In other words, the colour conversion layer 120 effectively acts to convert the colour of at least some of the light emitted by the light emitting element 110.

The colour conversion layer 120 may comprise a phosphor, quantum dot or other colour conversion material. It will be appreciated that, in some embodiments, the colour conversion layer 120 may be omitted and the coloured emission is provided directly by the light emitting element 110.

The passive optical nanostructure 130 is configured to receive the light rays 170 emitted by the colour conversion layer 120, convey the received light therethrough, and output the conveyed light.

The passive optical nanostructure 130 is configured to alter the direction of travel of at least some of the light which passes through it. The passive optical nanostructure 130 comprises a base layer 131, a plurality of spacers 132, and an air gap 133.

Light rays 170 incident on the boundary with the air gap 133 are passed through the passive optical nanostructure 130.

In this embodiment, the plurality of spacers 132 are pillars or columns. The plurality of spacers 132 extend perpendicularly from the base layer 132. The plurality of spacers 132 are uniformly distributed on the base layer 131 such that the distance p between adjacent spacers 132 (also known as the pitch of the spacers 132) is substantially the same for each pair of adjacent spacers 132.

Each of the plurality of spacers 132 has substantially the same height h as each of the other spacers 132. The air gap 133 is defined by the spacers 132 and the base layer 131. More specifically, the air gap 133 comprises air which fills the space between the spacers 132 from the base layer 131 up to the height of the spacers 132.

The base layer 131 is, for example, formed from an inorganic material such as silicon dioxide or may be a polymeric material. The spacers 132 are, for example, formed from a patterned inorganic material such as silicon dioxide or may be a polymeric material.

The adhesive layer 206 is arranged to adhere the optical structure 220 to the passive optical nanostructures 130. The adhesive layer 206 bonds the passive optical nanostructure 130 to the optical structure 220. More specifically, the adhesive layer 206 is bonded to the top of the spacers 132 and a bottom surface of the optical structure 220. The adhesive layer 206 may be formed from any appropriate adhesive, for example an optically clear adhesive (OCA) or a pressure sensitive adhesive (PSA).

The optical structure 220 is an optical element which manipulates the light that it receives. In this embodiment, the optical structure 220 is a transparent substrate (e.g. a glass substrate) which allows the light that it receives to pass through it. The illumination apparatus of FIG. 1A may be further bonded to another optical structure, or the optical structure may be formed in or on to the optical structure. Examples of optical structures will be described below.

In operation, light rays 180 from the light emitting element 110 reaching the interface 135 between the base layer 131 and the air gap 133 is totally internally reflected if it hits the interface at an angle of incidence greater than the critical angle. Light rays 180 may be recirculated within the light emitting element 110 or colour conversion layer 120. Some of the recirculated light rays 182 may be output through the passive optical nanostructure 130, increasing efficiency.

Thus, only light which hits the interface 135 at an angle of incidence less than the critical angle at the interface passes through the interface 135. A first light ray 160 is a ray emitted by the light emitting element 110 which has not been colour converted by colour conversion layer 120. The first light ray 160 enters and passes through the air gap 133 as its angle of incidence at the interface is less than the critical angle. Second and third light rays 170, 180 are rays which have been colour converted by colour conversion layer 120. The second light ray 170 enters and passes through the air gap 133 as its angle of incidence at the interface is less than the critical angle. The third light ray 180 is totally internally reflected at the interface as its angle of incidence at the interface is greater than the critical angle. The second and third light rays 170, 180 reach the interface between the air gap 133 and the adhesive layer 206 where they are refracted and pass into the adhesive layer 206. The second and third light ray 170, 180 then travel through the adhesive layer 206 and into the optical structure 220.

In this embodiment, the adhesive layer 206 and optical structure 220 have substantially the same refractive index and so no refraction occurs at the interface between the adhesive layer 206 and the optical structure 220. The above-described light propagation advantageously provides light reaching the optical structure 220 through the air gap has a restricted range of relatively small incidence angles within the optical structure 220. The range within the optical structure 220 from the surface normal 199 direction is substantially determined by the critical angle $\theta_c$.

This is because the light which would otherwise have reached the optical structure 220 at higher incidence angles does not reach the first substrate because it is instead totally internally reflected at the interface between the base layer 131 and the air gap 133. Advantageously the light cones propagating within the optical structure 220 are not Lambertian but have a limited cone angle. As will be described further below, such limited cone angles enable collimation of light output by optical surfaces of the optical structure 220.

Desirable dimensional properties of the passive optical nanostructure 130 for a nominal wavelength of 550 nm will now be described. The spacers 132 each have a height h greater than the wavelength $\lambda$ of the light travelling through the air gap 133 and spacers 132.

The height h of each of the plurality of spacers 132 of each passive optical nanostructure 130 is greater than a wavelength $\lambda$ of the light 160 emitted by the respective light emitting element 110. Further the height h may be greater than a wavelength $\lambda$ of the light emitted by the respective light emitting element 110 and colour conversion layer 120. Height h may be greater than the wavelength of the light which has been colour converted by the colour conversion layer 120 following emission by the respective light emitting element 110.

The width w and pitch p of the spacers 132 is arranged to minimise diffractive light scatter from the spacers 132 of the light travelling through the air gap 133, and to minimise guiding of light within the spacers 132.

The pitch p may be less than $2\lambda$, preferably less than $\lambda$, more preferably less than $\lambda/2$ and most preferably less than $\lambda/5$. The ratio w/p may be less than 0.5, and preferably less than 0.3 and more preferably less than 0.1.

In operation, the wave-like nature of light can be used to analyse propagation of light through the passive optical structure 130, that is light propagation that may appear to be provided by rays 160, 170, 180 is in fact provided by propagating optical modes that pass through the air gap 133 and spacers 132. In other words, a ray model of light propagation breaks down in the passive optical nanostructure 130. At such scales, the passive optical structure 130 cannot be resolved using a ray model and a wave propagation interpretation is more appropriate, with the passive optical structure 130 appearing as approximately a uniform structure to incident waves.

Such passive optical elements 130 may provide high angle diffraction or zero order diffraction. Advantageously diffractive scatter from the spacers and gaps between the spacers may be reduced, minimising light scatter. In an illustrative example of the embodiment of FIG. 5A hereinbelow, cross talk between adjacent curved reflectors 222A, 222B may advantageously be reduced Such elements may be provided by lithographic fabrication techniques on a monolithic wafer. The elements may be transferred from the monolithic wafer or may be arranged to provide a replication tool as described elsewhere herein.

By way of comparison with passive optical nanostructures a low effective index and small angle diffractive scatter may be achieved for example with passive optical microstructures with pitch p of 20 microns and width w of 5 microns. Such spacers guide incident light within the spacers, and provide Lambertian input to the optical structure 220. Undesirable cross talk between the reflectors 220A, 220B may be provided.

The passive optical nanostructure 130 has an effective refractive index $n_1$ given by the equation:

$$n_1 = 1 + \frac{w^2}{p^2}(n-1) \qquad \text{eqn. 1}$$

where $n_1$ is the effective refractive index, n is the refractive index of the spacers 132, p is the pitch of the spacers 132 and w is the width of each of the spacers 132.

At least some of the light 180 emitted by each light emitting element 110 undergoes total internal reflection at an interface with the air gap 133. w, p and n have values such that $n_1$ is a value which causes total internal reflection of at least some of the light reaching the passive optical nanostructure 130. The critical angle $\theta_c$ of light within the optical structure 220 is then given by the equation:

$$\theta_c = \sin^{-1}(n_1/n_2) \qquad \text{eqn. 2}$$

where $n_2$ is the refractive index of the material of the optical structure 220.

In other embodiments the spacers may have some distribution of spacings and distance p may have a distribution with an average pitch $p_{av}$ where $p_{av}$ is less than 1 micron, preferably less than 0.5 micron and most preferably less than 0.25 microns. Advantageously residual diffraction structures may be reduced in appearance in comparison to a fixed periodicity.

The above-described structure tends to allow light to be input into an optical element with controlled cone angle and high efficiency, while achieving bonding to the light emitting element by external substrates. Thus, said structure tends to allow optical cross talk in illumination systems to be reduced while also improving mechanical and thermal stability.

Figure 1B:
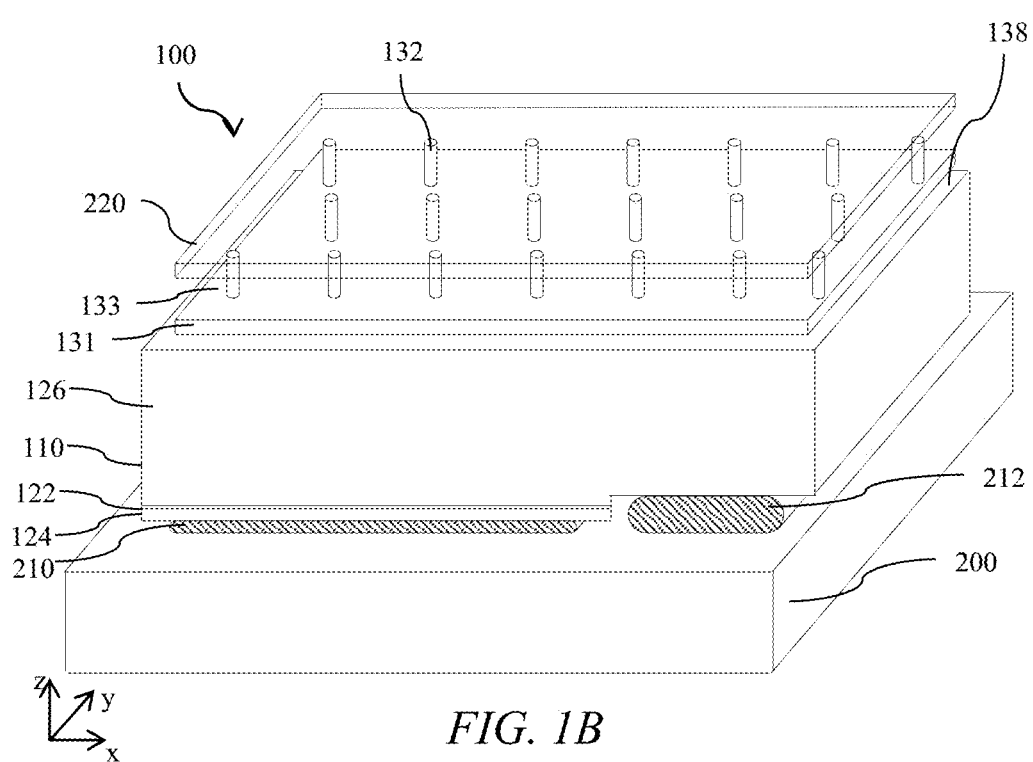
FIG. 1B illustrates a perspective view of a section of the illumination apparatus of FIG. 1A.

FIG. 1B illustrates a perspective view of a section of the illumination apparatus 100 of FIG. 1A. Features of the embodiment of FIG. 1B not discussed in further detail may be assumed to correspond to the features with equivalent reference numerals as discussed above, including any potential variations in the features.

In FIG. 1B, the adhesive layer 206 is present but not shown for ease of illustration. FIG. 1B further illustrates electrode pads 210, 212 for driving the light emitting element 110. The electrode pads 210, 212 are in contact with a surface of the light emitting element 110 which is opposite to the surface of the light emitting element 110 that the passive optical nanostructure is in contact with. In comparison to the arrangement of FIG. 1A, the colour conversion layer 120 is omitted.

FIG. 1B further illustrates the structure of an inorganic micro-LED 110. P-doped semiconductor layer 124 and n-doped semiconductor layer 126 is arranged on either side of a multiple quantum well structure 122. Electrodes 210, 212 are thus attached to p-doped and n-doped semiconductor layers 124, 126 respectively.

The passive optical nanostructure 130 is provided on the output side of the light emitting element 110. The first substrate 200 is provided upon which the light emitting element 110 is arranged. The first substrate 200 may further comprise reflective mask regions and control electrodes (not shown). In the region 138 a mask region may be provided so that all light is output from the light-emitting element 110 into the passive optical nanostructure 130. Further the sides of the light emitting element 110 may be coated to prevent light emission other than through the passive optical nanostructure. In other embodiments the passive optical nanostructure 130 may be larger than the light emitting element 110 so that substantially all the light from the light emitting element is directed through the passive optical nanostructure 130.

In an alternative embodiment the electrode pad 212 may be omitted. A transparent electrode (not shown) may be arranged on the optical substrate 220 and the spacers 132 may further be conductive such that electrical signals may be passed through the spacers 132. Electrical control of the light emitting elements 110 may be achieved from top side electrical contacts. The current injection area is spread over the light emitting element 110. Advantageously current crowding may be reduced and efficiency increased.

Advantageously a light emitting element may be provided suitable for illumination of optical structure 220 that is arranged to provide controlled illumination output in a thin structure.

Figure 2:
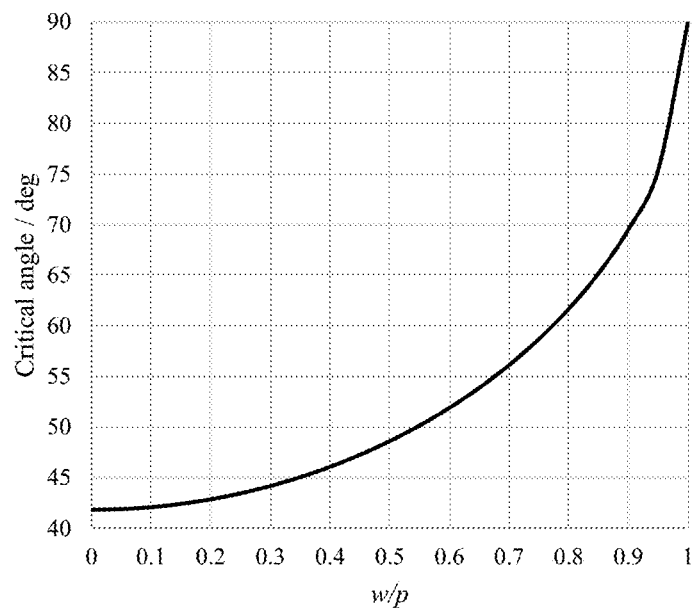
FIG. 2 illustrates a graph showing how the critical angle is dependent on parameters associated with the passive optical nanostructures.

FIG. 2 illustrates a graph showing how the critical angle is dependent on parameters associated with the passive optical nanostructures 130. Specifically, FIG. 2 illustrates the critical angle as a function of the width w of the spacers 132 of the passive optical nanostructure divided by the pitch of the spacers 132. Preferably the ratio of w/p is less than 0.5 which achieves a critical angle of less than 50° and more preferably the ratio of w/p is less than 0.3 which achieves a critical angle of less than 45°.

Figure 3:
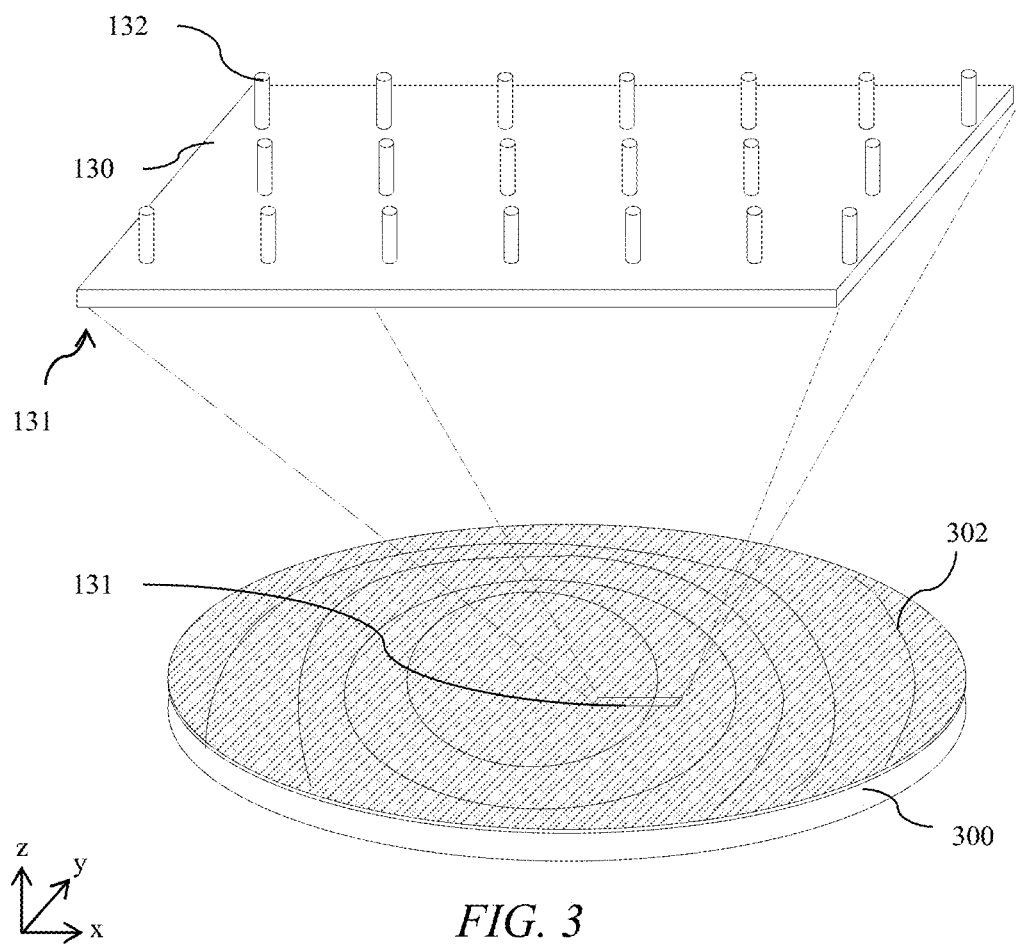

FIG. 3 illustrates a perspective view of a monolithic wafer 300 that the passive optical nanostructure 130 is formed as part of. Features of the embodiment of FIG. 3 not discussed in further detail may be assumed to correspond to the features with equivalent reference numerals as discussed above, including any potential variations in the features.

Prior to being used in the illumination apparatus 100 described above, the passive optical nanostructure is formed (e.g. grown) as part of the monolithic wafer 300 of passive optical nanostructures 130, and then extracted from the monolithic wafer 300 for use in manufacturing the illumination apparatus 100.

Extraction of regions 131 corresponding to selected passive optical nanostructures 130 may be provided by known extraction methods. For example regions 131 may be illuminated with light such as UV light which at least partially separates the selected passive optical nanostructures 130 from the growth substrate monolithic wafer 300. In other extraction methods, the regions 131 may be etched and extracted by means of mechanical detachment using mechanical stampers.

Multiple passive optical nanostructures 130 may be transferred in a single alignment step. Advantageously arrays of multiple passive optical nanostructures 130 may be transferred in a single step, reducing cost and complexity.

The selected passive optical nanostructures 130 corresponding to the extraction regions 131 are detached from the monolithic wafer 300 and adhered to a receiver that may be the light emitting element 110. The receiver may comprise an adhesive such that the selected passive optical nanostructures 130 attach thereto when brought into contact with the receiver.

Advantageously high precision passive optical nanostructures may be provided by known semiconductor lithography manufacturing processes.

After growth, the monolithic wafer 300 may comprise regions of different performance as illustrated by boundaries 302, and may further comprise scratches, debris and other defects that produce undesirable optical performance in operation. The passive optical nanostructures 130 of the present embodiment may advantageously be extracted only from desirable regions of the monolithic wafer. Advantageously uniformity of output may be increased. Further the yield of good passive optical nanostructures increased, achieving reduced cost. Arrays of light emitting elements with large numbers of light emitting elements may be provided with desirable optical output and low cost.

Multiple passive optical nanostructures may be provided between the light emitting element 110 and passive optical nanostructure 130 as will now be described.

Figure 4:
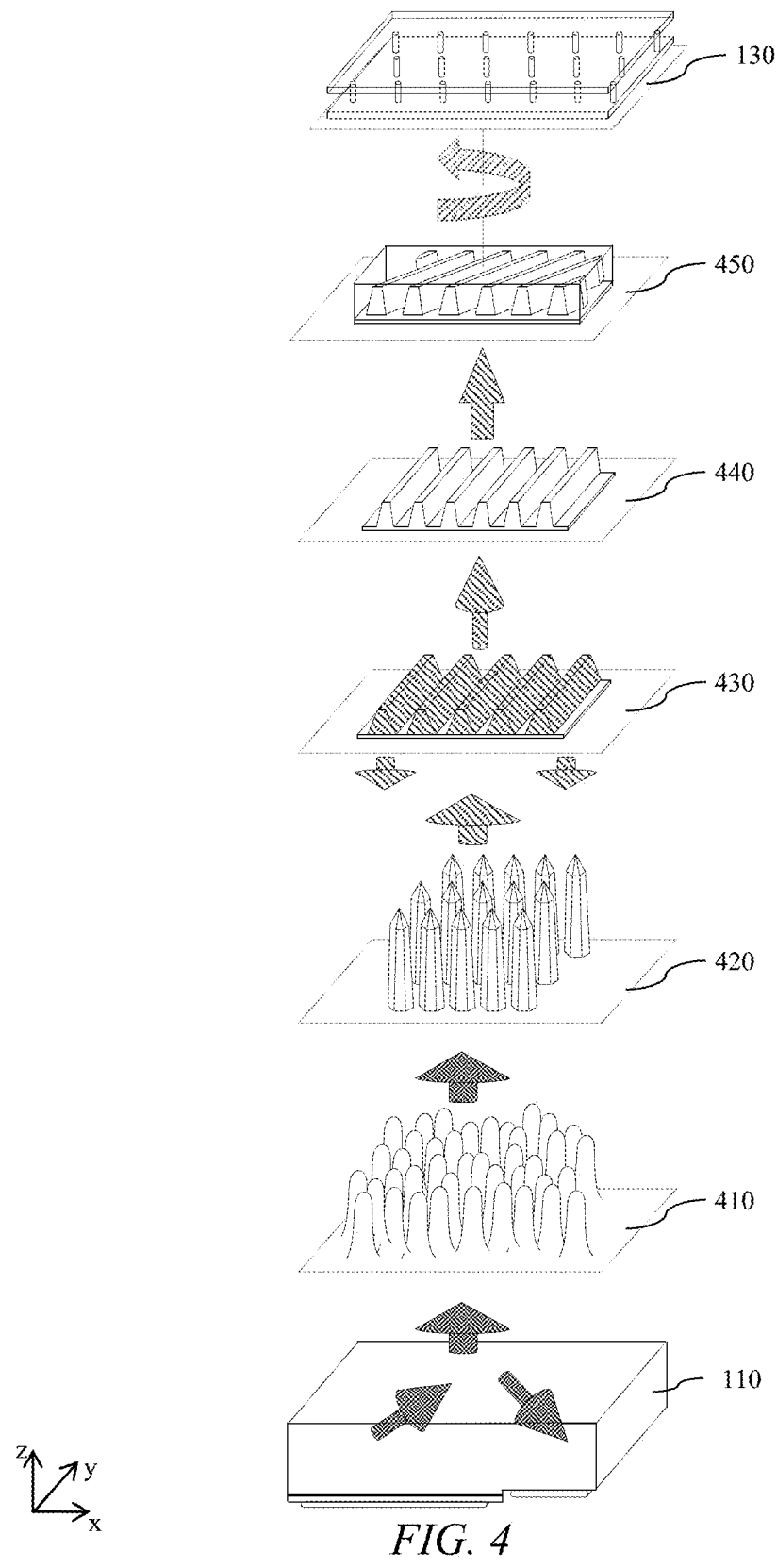
FIG. 4 illustrates how the passive optical nanostructure is stacked on the light emitting element 110 according to an embodiment.

FIG. 4 illustrates how the passive optical nanostructure 130 is stacked on the light emitting element 110 according to an embodiment. Features of the embodiment of FIG. 4 not discussed in further detail may be assumed to correspond to the features with equivalent reference numerals as discussed above, including any potential variations in the features.

In this embodiment, following extraction from the monolithic wafer 300, the passive optical nanostructure 130 is stacked on the light emitting element as part of a sequential order of different types of passive optical nanostructure all stacked on the light emitting element 110. Specifically, in this embodiment, in bottom to top order, the stack comprises a moth eye structure 410, a quantum rod structure 420, a collimating nanostructure 430, a wire grid polariser 440, a form birefringence retarder 450, and the passive optical nanostructure 130 described above with reference to FIGS. 1-4. In this way, the light reaching the passive optical nanostructure 130 from the light emitting element 110 will have been manipulated in various ways by the other types of passive optical nanostructure 410, 420, 430, 440, 450 in the stack before it is manipulated by the passive optical nanostructure 130. It will be appreciated that, in other embodiments, the passive optical nanostructure 130 may be swapped in position with any of the other types of passive optical nanostructure 410, 420, 430, 440, 450 shown in FIG. 4, depending on at what point in the stack it is desired that the light is manipulated by the passive optical nanostructure 130.

The operation of the passive optical nanostructure in an illumination apparatus will now be described.

Figure 5A:
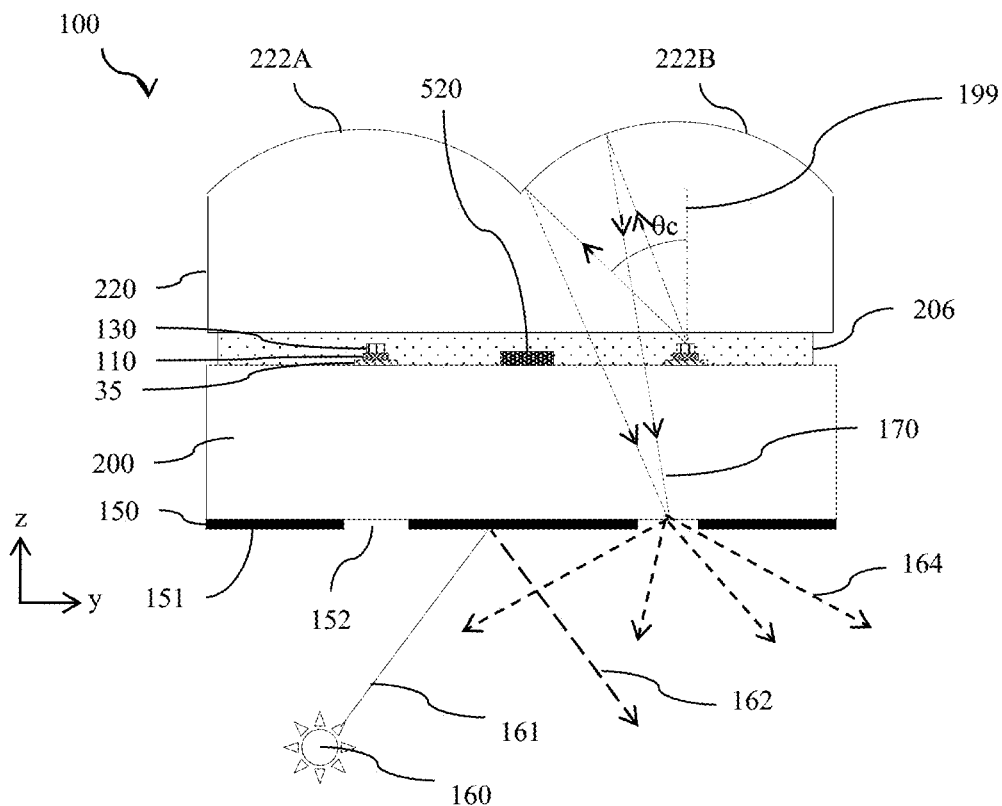
FIGS. 5A and 5B respectively illustrate cross-sectional and perspective views of an embodiment of an illumination apparatus.
Figure 5B:
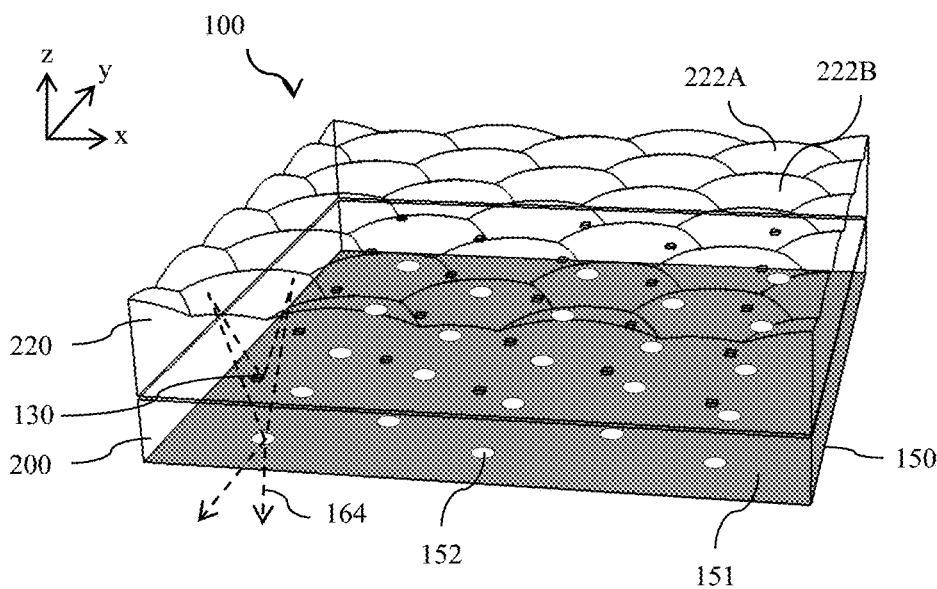

FIG. 5A and FIG. 5B respectively illustrate cross-sectional and perspective views of an embodiment of an illumination apparatus 100. Features of the embodiment of FIG. 5A and FIG. 5B not discussed in further detail may be assumed to correspond to the features with equivalent reference numerals as discussed above, including any potential variations in the features.

The illumination apparatus 100 comprises a substrate 200, an array of light emitting elements 110 disposed on the substrate 200, and an array of passive optical nanostructures 130 each disposed on a respective one of the light emitting elements 110.

In this embodiment, the light emitting elements 110 are arranged on reflective regions 35 such that light ray 170 is directed away from the substrate 200 by the light emitting elements 110 and reflective region 35. The reflective region prevents light from being transmitted into the substrate 200. Advantageously efficiency of transmission of light rays through the aperture 152 is increased.

In this embodiment, the illumination apparatus 100 further comprises an output mask 150 comprising a plurality of apertures 152 therein separated by opaque light absorbing region 151, the output mask 150 being disposed on an opposite side of the substrate 200 to the array of light emitting elements 110. The output mask 150 is configured to block light from passing therethrough, except for through its apertures 152. In this embodiment, the optical structure 220 is configured to direct at least some of the light received from the array of light emitting elements 110 through the apertures 152 in the output mask 150.

The output mask 150 opaque light absorbing region 151 may be formed from any appropriate opaque material, for example by printing a black material onto the substrate 200. The opaque region 151 may alternatively or additionally comprise a nanostructured black absorber, a "nanoblack" or other similar material such as that marketed by Acktar, (Kiryat-Gat, Israel). Advantageously very low reflectivity may be achieved from the front of the illumination apparatus.

More specifically, in this embodiment, the optical structure 220 is a reflective optical structure configured to reflect at least some of the light it receives back towards the substrate 200. In particular, the optical structure 220 comprises a plurality of concave curved reflective surfaces 222A, 222B, each aligned with a respective light emitting element 110 and configured to reflect at least some of the light received from that light emitting element 110.

The optical structure 220 may be formed from a transparent main body and a reflective material disposed thereon constituting the curved reflectors 222A, 222B. The body of the optical structure 220 may be a glass or polymer material. The surface relief structure of the curved reflectors may be provided by a moulding or casting process material in a polymer material for example. A reflective layer may be formed on the curved reflectors 222A, 222B, for example a deposited metal coating that may comprise silver or aluminium materials as well as surface adhesion promoters and protective layers.

Each of the apertures 152 of the output mask 150 may comprise a diffuser disposed therein, the diffusers being configured to scatter light that travels through the apertures 152 to provide output light rays 164. The diffuser in the aperture 152 provides rays 164 that may have a wide angular spread. Advantageously the illumination apparatus may provide illumination over wide illumination angles and in display applications the illumination apparatus may be visible from wide viewing angles.

The optical structure 220 may comprise a catadioptric optical structure. In the present embodiment, reflection at the curved reflective optical structure 222A, 222B and refraction at the output of the passive optical nanostructure 130 provides a catadioptric optical structure, that is the operation is provided by both refraction and reflection.

In operation light rays 170 are directed towards the curved reflective surface 222B at an angle from the surface normal 199 that is less than the critical angle θc, where the surface normal 199 of the passive optical nanostructure 130 is illustrated in FIG. 1A.

Advantageously, the embodiment of FIG. 5A and FIG. 5B tends to prevent light from a particular light emitting element 110 from reaching curved surfaces 222A that the particular light emitting element 110 is not aligned with. This is due to the passive optical nanostructure 130 on each light emitting element 110 totally internally reflecting light. For example, in this embodiment, the maximum angle θc at which a light ray can be output from the passive optical nanostructure 130 is set by the critical angle associated with the interface at which light from the light emitting element 110 enters the air gap of the passive optical nanostructure 130. Thus, this embodiment tends to prevent stray light associated with the reflective surfaces 222A reflecting light from light emitting elements 110 that they are not aligned with. Advantageously stray light between adjacent apertures 152 is reduced. In display applications, image cross talk is reduced and image contrast increased.

Referring to the graph of FIG. 2, the ratio of w/p may be provided so that the critical angle may be less than 45 degrees. The curved reflective surfaces 222A, 222B have no chromatic aberration and have geometric aberrations for light near the critical angle that may achieve efficient imaging of light from the light emitting element 110 to the respective aligned aperture 152. Advantageously high coupling efficiency may be achieved with low stray light from adjacent light emitting element 110. Cross talk between adjacent apertures 152 may be reduced.

The output mask 150 may be arranged to absorb incident light rays 161 from ambient illumination 160 (such as from room lighting or direct sunlight) such that the luminance of reflected light rays 162 is substantially lower than the luminance of light transmitted through the apertures 152. Advantageously in a display application the contrast of the image may be substantially enhanced in environments with high ambient illuminance. Reduced luminance of light rays 162 may be provided to achieve desirable contrast in such high ambient illuminance environments. Display power consumption may be reduced.

The opaque region 151 may comprise a material that has similar reflectance to the surrounding decor materials. The display may be hidden within the decor, for example in an automotive application to advantageously improve aesthetic appearance of the display when not in use.

The illumination apparatus 100 also comprises electronics 520 for driving the light emitting elements 110, the electronics 520 being disposed on the substrate 200 between adjacent light emitting elements 110. Advantageously the present embodiment provides relatively large area for placement of control electronics 520 without loss. The control electronics 520 are not visible to an observer of the illumination apparatus.

In one embodiment, the control electronics 520 may be arranged to provide global control of all of the light emitting elements 110. In another embodiment, the control electronics 520 and further external control electronics (not shown) may be arranged to provide a display function, that is each of the light emitting elements may be individually controllable with image data. In another embodiment, the control electronics 520 and further external control electronics (not shown) may be arranged to provide a backlight function for illumination of a transmissive spatial light modulator. Individual control of the light emitting elements 110 may be used to provide a high dynamic range function, and may be used to reduce display power consumption.

FIGS. 6A-D respectively illustrate top views of embodiments of pluralities of spacers 132. In FIG. 6A the spacers 132 are arranged on a square grid and have circular cross sections, in comparison to the hexagonal grid of FIG. 1B for example. Advantageously the area of the spacers 132 may be minimised. The visibility of residual diffraction may be adjusted in the design of the arrangement of spacers 132. In FIG. 6B the spacers 132 are linear and are extended in at least one direction. Advantageously the visibility of residual diffraction may be eliminated in one axis. Mechanical strength may be increased. In FIG. 6C the spacers 132 are annular and in FIG. 6D the spacers 132 are box shaped. Advantageously mechanical strength may be increased.

It may be further desirable to limit off-axis propagation of light from the edge of the light emitting elements 110.

Figure 7:
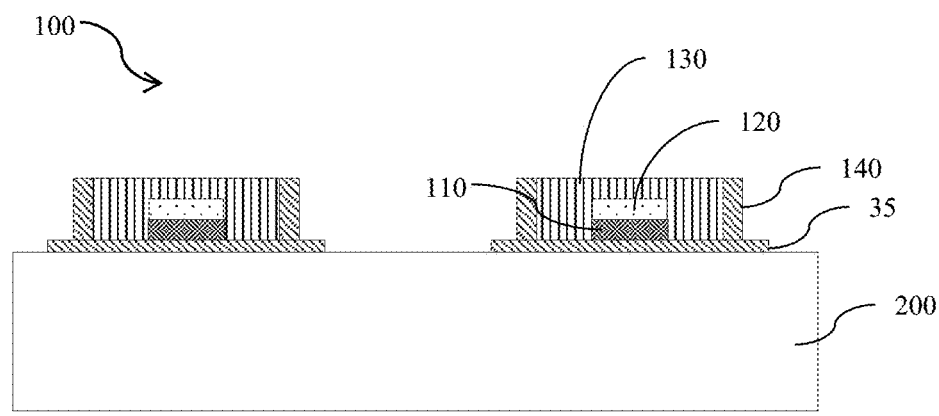
FIG. 7 illustrates a cross-sectional view of an embodiment of the illumination apparatus.

FIG. 7 illustrates a cross-sectional view of an embodiment of the illumination apparatus 100. Features of the embodiment of FIG. 7 not discussed in further detail may be assumed to correspond to the features with equivalent reference numerals as discussed above, including any potential variations in the features.

In this embodiment, the illumination apparatus 100 further comprises a cup 140 surrounding each of the plurality of passive optical nanostructures 130 and its respective light emitting element 110.

In this embodiment, each passive optical nanostructure 130 extends around the sides of its respective light emitting element 110. In this embodiment, the illumination apparatus 100 comprises a plurality of cups 140. Each cup 140 is disposed on the substrate 200 and surrounds the sides of a respective light emitting element 110 and passive optical nanostructure 130. Each cup 140 is configured to block light from passing therethrough, and thus acts to prevent light being output from the sides of its respective passive optical nanostructure 130. This helps to prevent wide angle light being output from the sides of the passive optical nanostructures 130. Advantageously cross talk between adjacent elements may be reduced. Some collimation of light output may be achieved, and head-on efficiency may be increased.

A method to form the apparatus of FIGS. 5A-B will now be described.

Figure 8A:
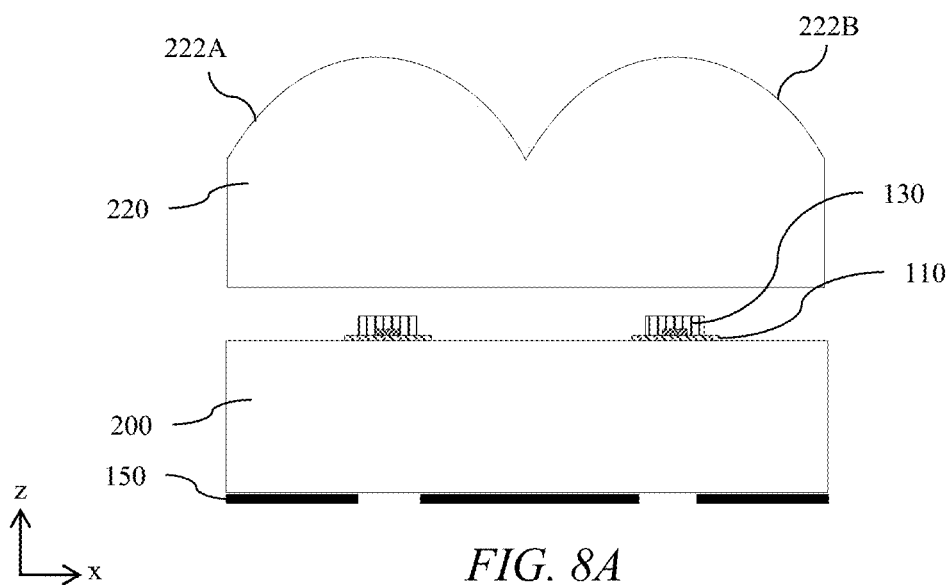
FIGS. 8A and 8B illustrate cross-sectional views of a method of attaching the optical structure to the substrate during manufacture of the illumination apparatus of the embodiment of FIG. 5A and FIG. 5B.
Figure 8B:
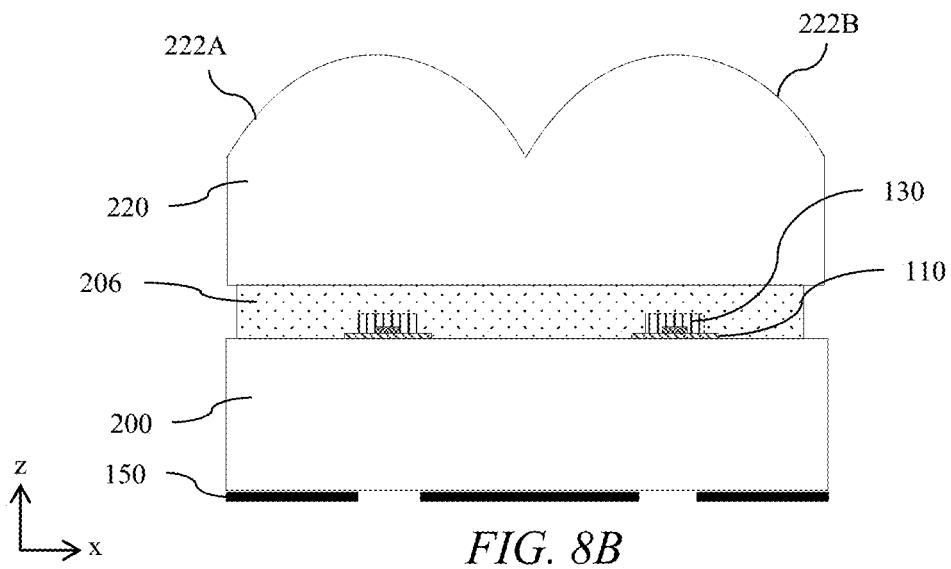

FIG. 8A and FIG. 8B illustrate cross-sectional views of a method of attaching the optical structure 220 to the substrate 200 during manufacture of the illumination apparatus 100 of the embodiment of FIG. 5A and FIG. 5B. Features of the embodiment of FIGS. 8A-B not discussed in further detail may be assumed to correspond to the features with equivalent reference numerals as discussed above, including any potential variations in the features.

As shown in FIG. 8A, first the optical structure is positioned above the substrate 200, the substrate 200 having the passive optical nanostructures 130, light emitting elements 110 and output mask 150 mounted thereto. The optical structure 220 is positioned such that each of its curved reflective surfaces 222A is aligned with a respective light emitting element 110. Then, as shown in FIG. 8B, the adhesive layer 206 is formed between the optical structure and the substrate 200 to attach the optical structure to the substrate 200. The adhesive layer 206 fills the space around the light emitting elements 110 and the passive optical nanostructures 130. The adhesive of the adhesive layer 206 may be injected into the space between the optical structure 220 and the substrate 200 in liquid form, and then subsequently set into solid form to bond the optical structure 220 to the substrate 200, for example by UV and/or thermal cure. Advantageously thermal and mechanical variations are minimised during operation. Fresnel reflections at the gap between the optical substrate 220 and the first substrate 200 are reduced, increasing optical efficiency and reducing cross talk between adjacent channels.

The passive optical nanostructures 130 may be hydrophobic so that their air gaps are not filled with adhesive if the adhesive is injected in liquid form. Advantageously, the surface tension may be arranged so that the adhesive material 206 does not fill the air gaps 133 between the spacers 132 of the passive optical nanostructure 130 and optical output may be maintained within the critical angle θc within the optical structure 220.

Further methods to provide the optical apparatus of the embodiment of FIGS. 5A-B will now be described.

Figure 9:
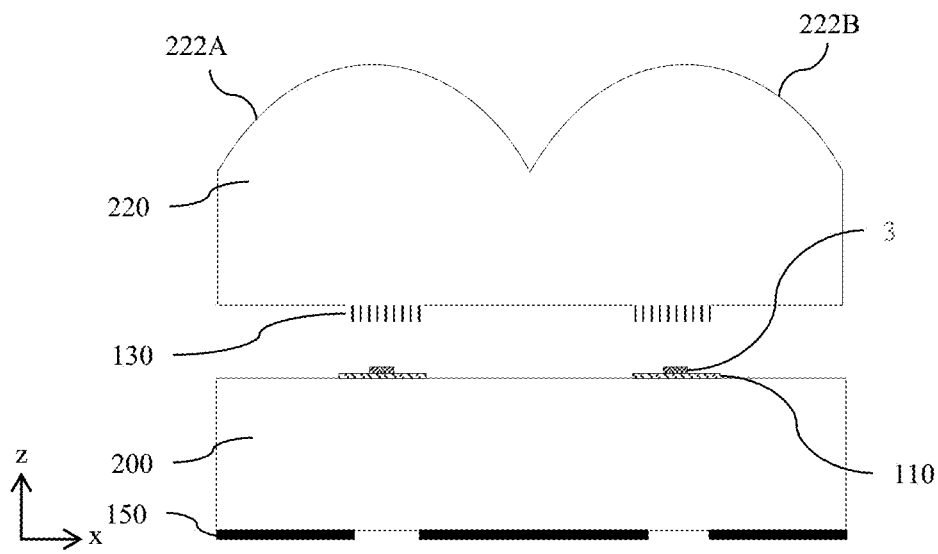
FIGS. 9 and 10 illustrate cross-sectional views of another method of attaching the optical structure to the substrate during manufacture of the illumination apparatus of the embodiment of FIG. 5A and FIG. 5B.
Figure 10:
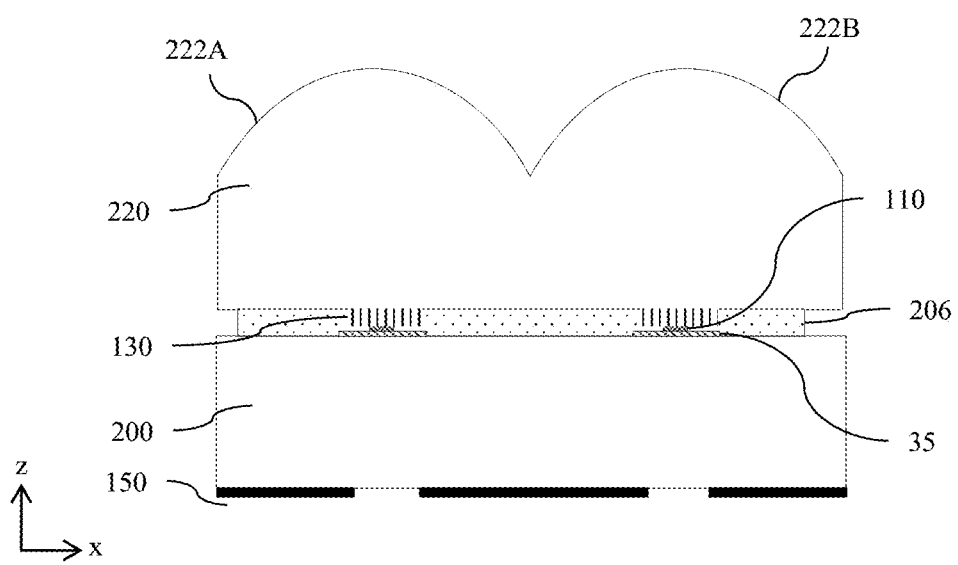

FIG. 9 and FIG. 10 illustrate cross-sectional views of another method of attaching the optical structure 220 to the substrate 200 during manufacture of the illumination apparatus 100 of the embodiment of FIG. 5A and FIG. 5B. Features of the embodiment of FIGS. 9-10 not discussed in further detail may be assumed to correspond to the features with equivalent reference numerals as discussed above, including any potential variations in the features.

As shown in FIG. 9, in this method, the optical structure 220 is positioned above the substrate 200, with the substrate 200 having the light emitting elements 110, reflective mask 35 and output mask 150 mounted thereto, and the optical structure 220 having the passive optical nanostructures 130 mounted thereto. Each passive optical nanostructure 130 is mounted to the optical structure 220 such that it is aligned with a respective curved reflective surface 222A of the optical structure 220. The optical structure is positioned such that each of its curved reflective surfaces 222A is aligned with a respective light emitting element 110. Then, as shown in FIG. 10, the adhesive layer 206 is formed between the optical structure and the substrate 200 to attach the optical structure to the substrate 200. The adhesive layer 206 fills the space around the light emitting elements 110 and the passive optical nanostructures 130. The adhesive of the adhesive layer 206 may be injected into the space between the optical structure 220 and the substrate 200 in liquid form, and then subsequently set into solid form to bond the optical structure 220 to the substrate 200. The passive optical nanostructures 130 may be hydrophobic so that their air gaps are not filled with adhesive 206 if the adhesive 206 is injected in liquid form.

Figure 11A:
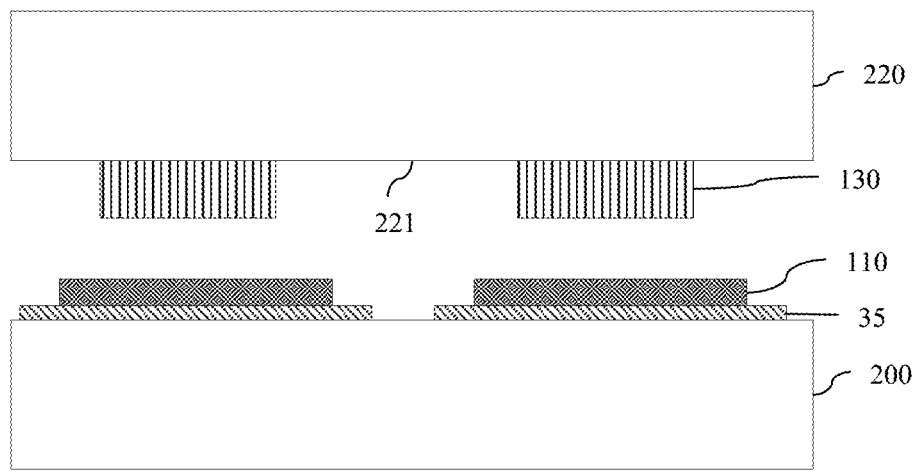
FIGS. 11A and 11B illustrate cross-sectional views of a method of attaching the optical structure to the substrate during manufacture of the illumination apparatus of an embodiment comprising a passive optical nanostructure arranged on the input side of an optical structure wherein the passive optical nanostructure is formed on the optical structure.
Figure 11B:
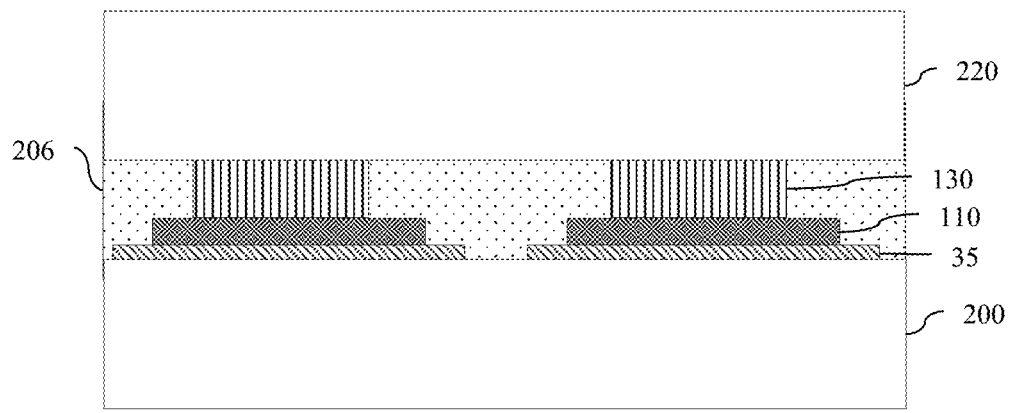

FIGS. 11A-B illustrate cross-sectional views of a method of attaching the optical structure to the substrate during manufacture of the illumination apparatus of an embodiment comprising a passive optical nanostructure arranged on the input side of an optical structure wherein the passive optical nanostructure is formed on the optical structure. Features of the embodiment of FIGS. 12A-B not discussed in further detail may be assumed to correspond to the features with equivalent reference numerals as discussed above, including any potential variations in the features.

In comparison to the method of FIGS. 8A-B, the passive optical nanostructures 130 are arranged on the input side 221 of the optical structure 220. The passive optical nanostructures 130 may be from a monolithic wafer as illustrated in FIG. 3. An adhesive may be formed on the optical structure 220 prior to attachment of the passive optical nanostructure 130. Multiple passive optical nanostructures 130 may be transferred in a single alignment step. Advantageously the fewer process steps are provided for the light emitting elements 110, reducing cost and complexity of the assembled first substrate 200.

Figure 12A:
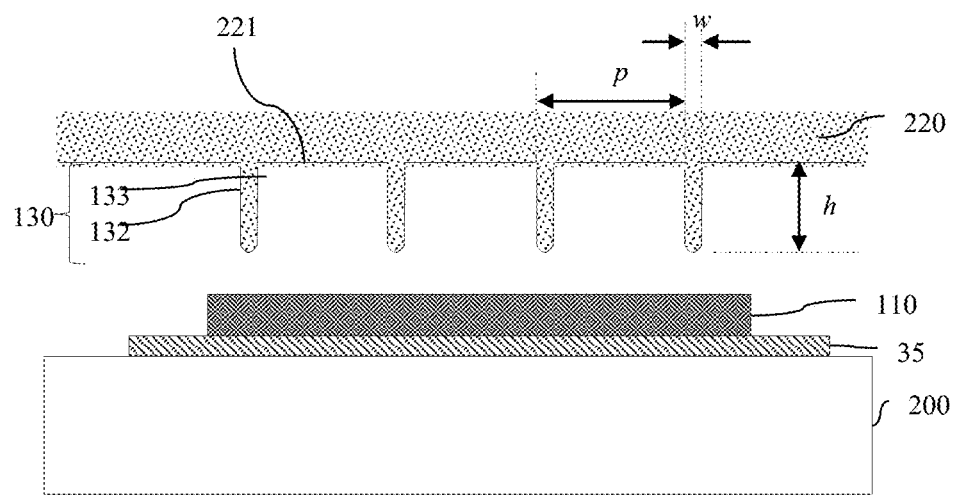
FIGS. 12A and 12B illustrate cross-sectional views of a method of attaching the optical structure to the substrate during manufacture of the illumination apparatus of an embodiment comprising a passive optical nanostructure arranged on the input side of an optical structure wherein the passive optical nanostructure is formed in the material of the optical structure.
Figure 12B:
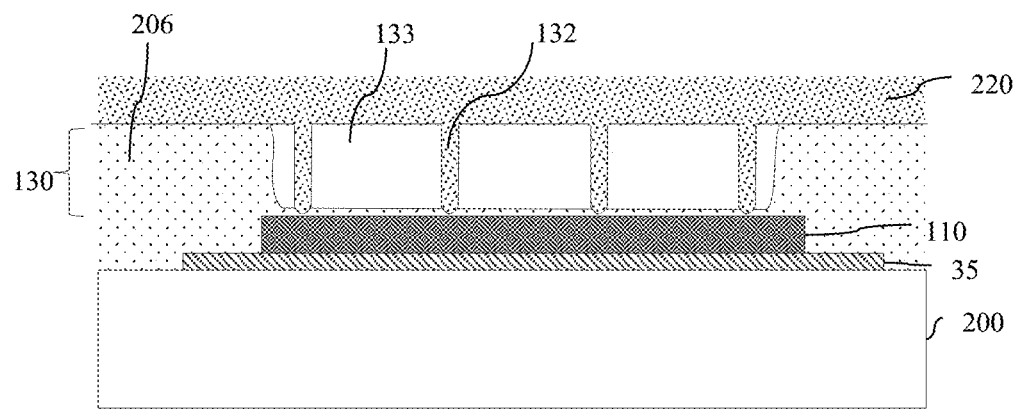

FIGS. 12A-B illustrate cross-sectional views of a method of attaching the optical structure to the substrate during manufacture of the illumination apparatus of an embodiment comprising a passive optical nanostructure arranged on the input side of an optical structure wherein the passive optical nanostructure is formed in the material of the optical structure. Features of the embodiment of FIGS. 11A-B not discussed in further detail may be assumed to correspond to the features with equivalent reference numerals as discussed above, including any potential variations in the features.

In comparison to the embodiment of FIGS. 11A-B, as shown in FIG. 12A, the passive optical nanostructure 130 is formed in the material of the optical structure 220 on the input side and is not transferred from a monolithic wafer. FIG. 12B illustrates that the optical structure 200 is attached to the substrate 200 by means of adhesive 200. Gaps 133 may be maintained by hydrophobic pillars 132 for example.

Advantageously the cost of the passive optical nanostructure may be reduced by incorporating the structure into a tool used to form the input side 221 of the optical structure.

Figure 13:
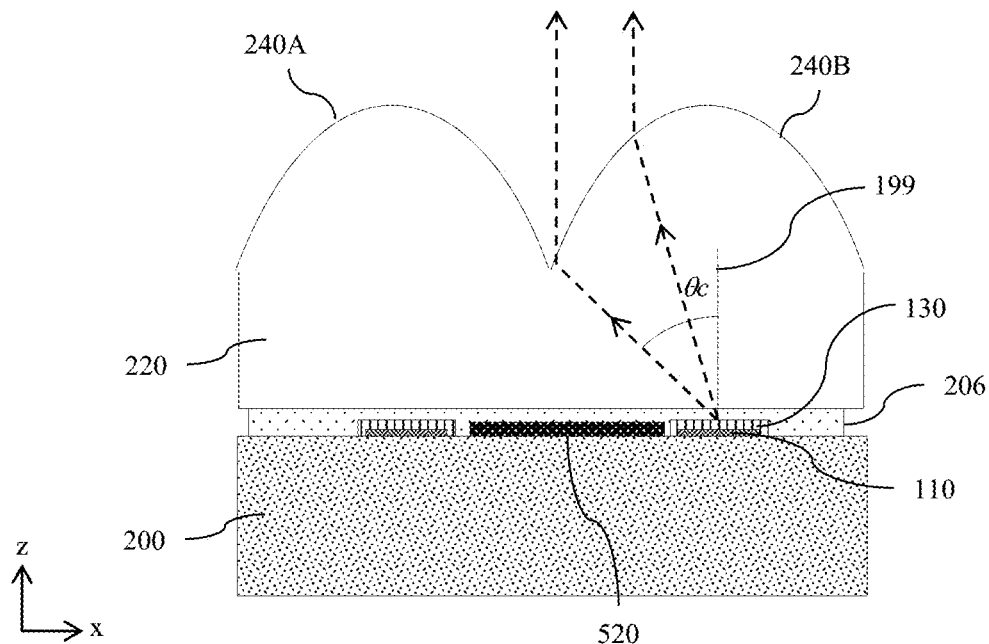
FIG. 13 and FIG. 14 illustrate cross-sectional views of two more embodiments of the illumination apparatus.
Figure 14:
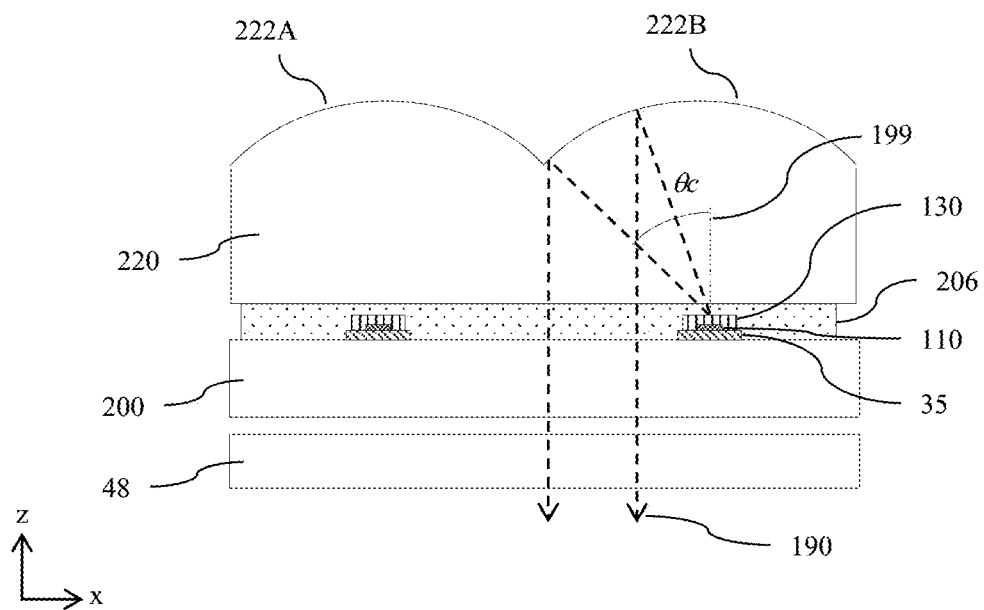

FIG. 13 and FIG. 14 illustrate cross-sectional views of two more embodiments of the illumination apparatus 100. Features of the embodiments of FIG. 13 and FIG. 14 not discussed in further detail may be assumed to correspond to the features with equivalent reference numerals as discussed above, including any potential variations in the features.

FIG. 13 illustrates an embodiment in which the optical structure 220 is transmissive and the substrate 200 is opaque so that light cannot travel through it. Light is transmitted through optical structure 220 so that light emitted from the light emitting elements 110 is output from the illumination apparatus 100 without travelling back towards the substrate 200. Advantageously in comparison to FIG. 5A, higher density of electronic control components 520 and electrodes may be arranged on the substrate 200 without reduction of efficiency.

Lenses 240A, 240B are arranged to provide collimated output. A backlight apparatus for privacy display may be provided.

FIG. 14 illustrates an embodiment in which the optical structure 220 is reflective and reflects light back towards the substrate 200. In the embodiment of FIG. 14, the substrate is transparent so that light can travel through it. Thus, in the embodiment of FIG. 14, light emitted the light emitting elements 110 is output from the illumination apparatus 100 through the substrate 200. In comparison to the arrangement of FIG. 5A, the output is collimated and no mask 150 is provided. Advantageously a collimated output illumination may be achieved with high efficiency in a thin structure.

A display apparatus may comprise a backlight apparatus comprising the illumination apparatus 100 to illuminate transmissive spatial light modulator 48. Such an apparatus may be provided for a display apparatus such as a privacy display.

In alternative embodiments the spatial light modulator 48 may be omitted and the illumination apparatus may be used for providing directional environmental illumination, for example for downlighting or for automotive headlights.

A thin backlight structure for a display apparatus comprising the passive optical nanostructures 130 of the present embodiment will now be described.

Figure 15:
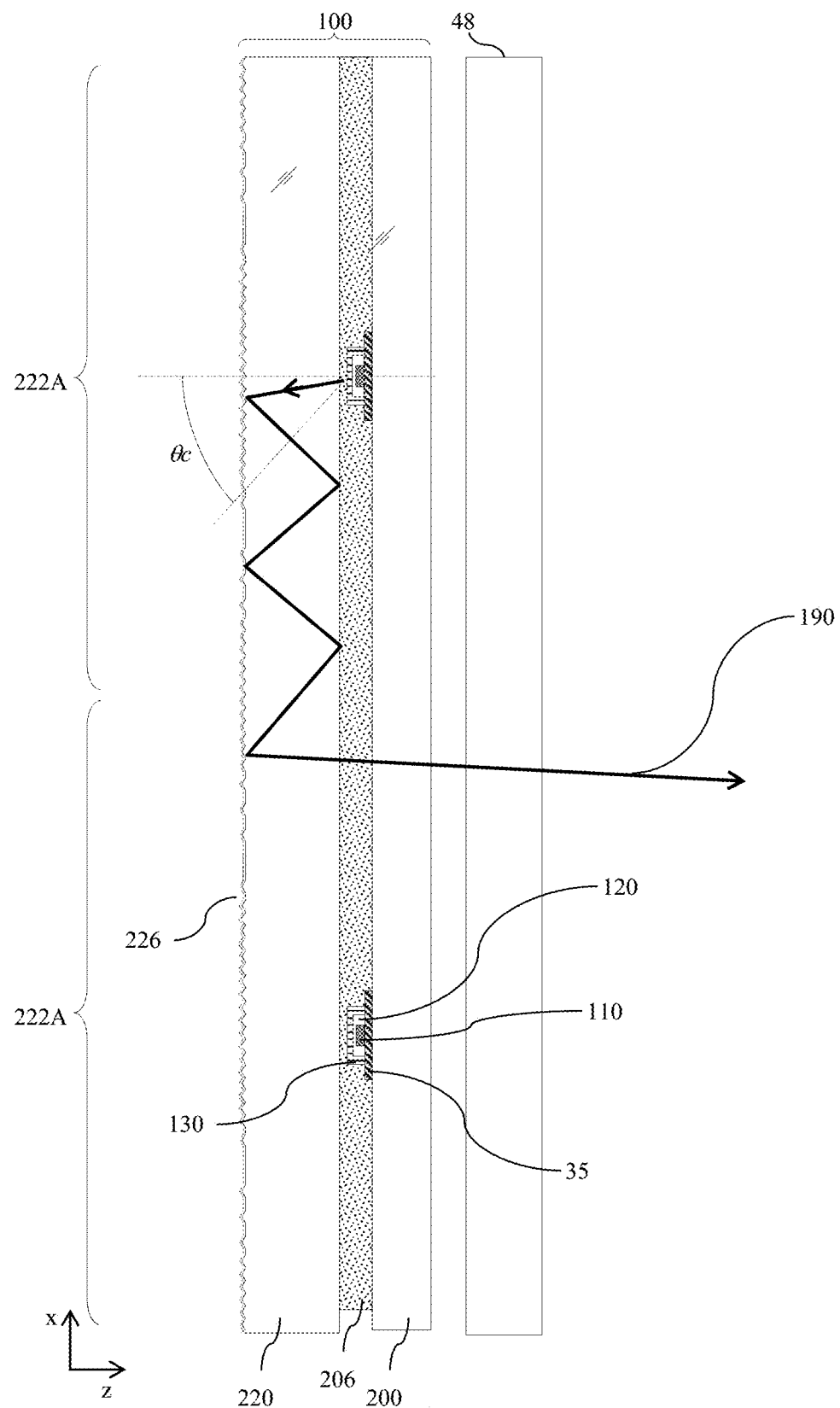
FIG. 15 illustrates a further embodiment of the illumination apparatus.

FIG. 15 illustrates a further embodiment of the illumination apparatus 100. Features of the embodiment of FIG. 15 not discussed in further detail may be assumed to correspond to the features with equivalent reference numerals as discussed above, including any potential variations in the features.

The substrate 200 is transparent and the optical structure 220 is reflective with regions 222A, 222B. In both of these embodiments, the optical structure 220 comprises a faceted reflective surface comprising light deflecting microstructures 226 for providing collimated output light rays 190. In comparison to the embodiment of FIG. 5A, light rays 190 that are input into the optical structure 220 at angles to the normal 199 are guided within the structure 220. Such guided light spreads away from the respective light emitting element 110. High levels of collimation may be achieved in thin packages. Further, the substrates 200, 220 may be bonded to achieve thermal and mechanical stability.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A method of manufacturing an illumination apparatus, comprising:

mounting an array of light emitting elements on a substrate;

mounting a passive optical nanostructure on each of the light emitting elements, each passive optical nanostructure comprising an air gap; and bonding an optical structure to the substrate such that each passive optical nanostructure is disposed between its respective light emitting element and the optical structure, wherein the array of light emitting elements is a non-monolithic array of light emitting elements, and the method further comprises extracting the non-monolithic array of light emitting elements from a monolithic wafer.

2. An illumination apparatus, comprising:

a first substrate;

an optical structure;

an array of light emitting elements disposed between the first substrate and the optical structure;

an array of passive optical nanostructures disposed between the first substrate and the optical structure, each passive optical nanostructure being disposed on a respective one of the light emitting elements, each passive optical nanostructure comprising an air gap, and each passive optical nanostructure being disposed between its respective light emitting element and the optical structure; and a cup surrounding each of the plurality of passive optical nanostructures and its respective light emitting element, wherein each passive optical nanostructure is configured to receive light emitted by its respective light emitting element, pass the received light therethrough, and output the passed light towards the optical structure, and wherein each passive optical nanostructure comprises a plurality of spacers configured to separate its respective light emitting element from the optical structure.

3. The illumination apparatus of claim 2, wherein the air gap comprises air which fills the space in between the plurality of spacers.

4. The illumination apparatus of claim 2, wherein a height of each of the plurality of spacers of each passive optical nanostructure is greater than a wavelength of the light emitted by the respective light emitting element.

5. A backlight apparatus comprising the illumination apparatus of claim 2.

6. The illumination apparatus of claim 2, wherein at least some of the light emitted by each light emitting element undergoes total internal reflection at an interface with the air gap.

7. The illumination apparatus of claim 2, wherein the passive optical nanostructures are hydrophobic.

8. The illumination apparatus of claim 2, wherein the optical structure is a catadioptric optical structure.

9. The illumination apparatus of claim 2, further comprising an adhesive layer arranged to adhere the optical structure to the passive optical nanostructures.

10. The illumination apparatus of claim 2, further comprising a colour conversion layer disposed between each light emitting element and its respective passive optical nanostructure.

11. The illumination apparatus of claim 2, wherein the light emitting elements are micro-LEDs with a maximum dimension which is less than 300 μm.

12. An illumination apparatus, comprising:

a first substrate;

an optical structure;

an array of light emitting elements disposed between the first substrate and the optical structure;

an array of passive optical nanostructures disposed between the first substrate and the optical structure, each passive optical nanostructure being disposed on a respective one of the light emitting elements, each passive optical nanostructure comprising an air gap, and each passive optical nanostructure being disposed between its respective light emitting element and the optical structure; and a mask comprising a plurality of apertures therein, the mask being disposed on an opposite side of the first substrate to the array of light emitting elements, wherein each passive optical nanostructure is configured to receive light emitted by its respective light emitting element, pass the received light therethrough, and output the passed light towards the optical structure.

13. The illumination apparatus of claim 12, wherein the optical structure is configured to direct at least some of the light received from the array of light emitting elements through the apertures in the mask.

14. The illumination apparatus of claim 12, wherein the light emitting elements are micro-LEDs with a maximum dimension which is less than 300 μm.

15. A display apparatus comprising the illumination apparatus of claim 12.

16. The illumination apparatus of claim 12, further comprising a colour conversion layer disposed between each light emitting element and its respective passive optical nanostructure.

17. The illumination apparatus of claim 12, wherein each passive optical nanostructure comprises a plurality of spacers configured to separate its respective light emitting element from the optical structure.

18. The illumination apparatus of claim 17, wherein the air gap comprises air which fills the space in between the plurality of spacers.

19. The illumination apparatus of claim 17, wherein a height of each of the plurality of spacers of each passive optical nanostructure is greater than a wavelength of the light emitted by the respective light emitting element.

20. The illumination apparatus of claim 12, wherein at least some of the light emitted by each light emitting element undergoes total internal reflection at an interface with the air gap.

21. The illumination apparatus of claim 12, wherein the passive optical nanostructures are hydrophobic.

22. The illumination apparatus of claim 12, wherein the optical structure is a catadioptric optical structure.

23. The illumination apparatus of claim 12, further comprising an adhesive layer arranged to adhere the optical structure to the passive optical nanostructures.

* * * * *